(12) United States Patent
Koyama et al.

(10) Patent No.: US 8,334,719 B2
(45) Date of Patent: Dec. 18, 2012

(54) SEMICONDUCTOR DEVICE HAVING FUNCTION OF THYRISTOR

(75) Inventors: Jun Koyama, Sagamihara (JP); Kazunori Watanabe, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/943,570

(22) Filed: Nov. 10, 2010

(65) Prior Publication Data

US 2011/0115545 A1    May 19, 2011

(30) Foreign Application Priority Data

Nov. 13, 2009   (JP) ................................. 2009-259900

(51) Int. Cl.
*H03K 17/687* (2006.01)
(52) U.S. Cl. ...................................... 327/427
(58) Field of Classification Search .................. 327/427, 327/434, 437
See application file for complete search history.

(56) References Cited

U.S. PATENT DOCUMENTS

| | | | |
|---|---|---|---|
| 4,794,441 A * | 12/1988 | Sugawara et al. | 257/124 |
| 5,399,915 A * | 3/1995 | Yahata | 327/108 |
| 5,464,994 A | 11/1995 | Shinohe et al. | |
| 5,477,065 A | 12/1995 | Nakagawa et al. | |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,224,204 B2 * | 5/2007 | Walter | 327/427 |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,365,372 B2 | 4/2008 | Sugizaki | |

(Continued)

FOREIGN PATENT DOCUMENTS

EP    1737044 A    12/2006

(Continued)

OTHER PUBLICATIONS

Fortunato.E et al., "Wide-Bandgap High-Mobility ZNO Thin-Film Transistors Produced at Room Temperature,", Appl. Phys. Lett. (Applied Physics Letters) , Sep. 27, 2004, vol. 85, No. 13, pp. 2541-2543.

(Continued)

*Primary Examiner* — Hai L Nguyen
(74) *Attorney, Agent, or Firm* — Eric J. Robinson; Robinson Intellectual Property Law Office, P.C.

(57) ABSTRACT

An object is to provide a semiconductor device that can realize a function of a thyristor without complication of the process. A semiconductor device including a memory circuit that stores a predetermined potential by reset operation and initialization operation is provided with a circuit that rewrite data in the memory circuit in accordance with supply of a trigger signal. The semiconductor device has a structure in which a current flowing through the semiconductor device is supplied to a load by rewriting data in the memory circuit, and thus can function as a thyristor.

6 Claims, 12 Drawing Sheets

U.S. PATENT DOCUMENTS

| | | | |
|---|---|---|---|
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0012945 A1 | 1/2007 | Sugizaki |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |

FOREIGN PATENT DOCUMENTS

| | | |
|---|---|---|
| EP | 2226847 A | 9/2010 |
| JP | 60-189029 A | 9/1985 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 11-354774 A | 12/1999 |
| JP | 2000-044236 A | 2/2000 |
| JP | 2000-150900 A | 5/2000 |
| JP | 2001-284574 | 10/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-110110 | 4/2003 |
| JP | 2004-103957 A | 4/2004 |
| JP | 2004-273614 A | 9/2004 |
| JP | 2004-273732 A | 9/2004 |
| JP | 2007-049113 | 2/2007 |
| JP | 2009-181979 | 8/2009 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW'08 : Proceedings of the 15th International Display Workshops, Dec. 3, 2008, pp. 1637-1640.

Hayashi.R et al., "42.1: Invited Paper: Improved Amorphous In-Ga-Zn-O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the $In_2O_3$-$Ga_2ZnO_4$-ZnO system at 1350° C.,", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)m$ (m =3, 4, and 5), $InGaO_3(ZnO)_3$, and $Ga_2O_3(ZnO)m$ (m=7, 8, 9, and 16) in the $In_2O_3$-$ZnGa_2O_4$-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled AMORPHOUS GIZO (Ga2O3-In2O3-ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTS,", IDW '09 : Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZNO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZNO TFTS) for AMLCDS,", Journal of the SID , 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In-Ga-Zn-Oxide TFTS With a Novel Passivation Layer,", SID Digest '09 : SID International Symposium Digest of Technical Papers, May 31, 2009, pp. 284-287.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van De Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japen Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic NANO-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 1, 2002, vol. 1, pp. 64-68.

Kimizuka.N. et al., "Spinel,YBFE2O4, and YB2FE3O7 Types of Structures for Compounds in the In2O3 and SC2O3-A2O3-BO Systems [A; Fe, Ga, Or Al; B: Mg, Mn, Fe, Ni, Cu,Or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", JPN. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), 2007, vol. 76, pp. 16202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

International Search Report (Application No. PCT/JP2010/068412) Dated Jan. 25, 2011.

Written Opinion (Application No. PCT/JP2010/068412) Dated Jan. 25, 2011.

\* cited by examiner

Prior Art

US 8,334,719 B2

SEMICONDUCTOR DEVICE HAVING FUNCTION OF THYRISTOR

TECHNICAL FIELD

The present invention relates to a semiconductor device and a method for driving the semiconductor device.

In this specification and the like, the term "semiconductor device" means all devices that can operate by utilizing semiconductor characteristics. For example, a display device and an integrated circuit are included in the category of the semiconductor device.

BACKGROUND ART

A thyristor that is known as a power device is formed in a single crystal silicon substrate and kept in a conduction state with a trigger signal such as current (e.g., see Patent Document 1).

A thyristor includes a pnpn layer in which p-type semiconductor layers and n-type semiconductor layers are alternately arranged. An equivalent circuit of a thyristor is composed of an npn bipolar transistor (hereinafter referred to as an npn transistor) and a pnp bipolar transistor (hereinafter referred to as a pnp transistor). FIG. 12 illustrates a specific circuit configuration.

FIG. 12 illustrates a thyristor 1100 including an npn transistor 1101 and a pnp transistor 1102. In the thyristor 1100, an emitter terminal of the npn transistor 1101 is connected to a wiring 1103 to which a high power supply potential VDD is supplied; a collector terminal of the npn transistor 1101 is connected to a base terminal of the pnp transistor 1102 and an input terminal IN to which a trigger signal is supplied; a base terminal of the npn transistor 1101 is connected to a collector terminal of the pnp transistor 1102; and an emitter terminal of the pnp transistor 1102 is connected to a wiring 1104 to which a low power supply potential VSS is supplied.

Operation of the thyristor in FIG. 12 will be briefly described. When a trigger signal is an L signal (also referred to as a low-level signal or a low potential signal), electrical continuity is not established between the collector terminal and the emitter terminal of the pnp transistor 1102 (i.e., the pnp transistor 1102 is turned off), and a current flowing through the collector terminal of the pnp transistor 1102 (hereinafter referred to as a collector current) is hardly detected. Thus, a current flowing through the base terminal of the npn transistor 1101 (hereinafter referred to as a base current) is hardly detected, so that the npn transistor 1101 is also turned off and almost no current flows between the wiring 1103 and the wiring 1104. When a trigger signal is an H signal (also referred to as a high-level signal or a high potential signal), electrical continuity is established between the collector terminal and the emitter terminal of the pnp transistor 1102 (i.e., the pnp transistor 1102 is turned on), and a collector current is detected at the collector terminal of the pnp transistor 1102. Thus, a base current of the npn transistor 1101 flows, and the npn transistor 1101 is brought into conduction. When the npn transistor 1101 is brought into conduction, a collector current of the npn transistor 1101 is detected, and the pnp transistor 1102 is kept in a conduction state. The thyristor 1100 has a feature such that a large current obtained by adding the collector current of the pnp transistor 1102 to the collector current of the npn transistor 1101 flows between the wiring 1103 and the wiring 1104.

REFERENCE

Patent Document 1: Japanese Published Patent Application No. H11-354774

DISCLOSURE OF INVENTION

The thyristor illustrated in FIG. 12 is formed with a combination of pn junctions in a single crystal semiconductor substrate. For that reason, when the thyristor is formed in combination with a process for forming an insulated gate transistor (also referred to as an insulated gate field effect transistor (IGFET) or a metal insulator semiconductor field effect transistor (MISFET)), the process becomes complicated. Moreover, when a thyristor is formed using a thin film transistor which is an insulated gate transistor including a silicon film as a semiconductor layer, a problem arises, such as the withstanding voltage, so that a desired function cannot be obtained.

In view of the above, an object of one embodiment of the present invention is to provide a semiconductor device that can realize a function of a thyristor without complication of the process.

One embodiment of the present invention is a semiconductor device including first to ninth insulated gate transistors; a capacitor; a first wiring to which a first high power supply potential is supplied; a second wiring to which a second high power supply potential is supplied; and a third wiring to which a low power supply potential is supplied. A gate of the first insulated gate transistor is electrically connected to an input terminal A first terminal of the first insulated gate transistor is electrically connected to the third wiring. A second terminal of the first insulated gate transistor is electrically connected to a first terminal of the second insulated gate transistor. A gate of the second insulated gate transistor is electrically connected to a first terminal of the seventh insulated gate transistor and a first terminal of the eighth insulated gate transistor. A second terminal of the second insulated gate transistor is electrically connected to a first terminal of the third insulated gate transistor, a first terminal of the fourth insulated gate transistor, and a gate of the sixth insulated gate transistor. A gate of the third insulated gate transistor is electrically connected to the first wiring. A second terminal of the third insulated gate transistor is electrically connected to the second wiring. A gate of the fourth insulated gate transistor is electrically connected to a first terminal of the fifth insulated gate transistor, a first terminal of the sixth insulated gate transistor, a first electrode of the capacitor, a gate of the eighth insulated gate transistor, and a gate of the ninth insulated gate transistor. A second terminal of the fourth insulated gate transistor is electrically connected to the third wiring. A gate of the fifth insulated gate transistor is electrically connected to the first wiring. A second terminal of the fifth insulated gate transistor is electrically connected to the second wiring. A second terminal of the sixth insulated gate transistor is electrically connected to the third wiring. A gate of the seventh insulated gate transistor is electrically connected to the first wiring. A second terminal of the seventh insulated gate transistor is electrically connected to the second wiring. A second terminal of the eighth insulated gate transistor is electrically connected to the third wiring. A first terminal of the ninth insulated gate transistor is electrically connected to an output terminal A second terminal of the ninth insulated gate transistor is electrically connected to the third wiring. A second electrode of the capacitor is electrically connected to the third wiring.

In the semiconductor device according to one embodiment of the present invention, the first to ninth insulated gate transistors may each include a semiconductor layer formed using an oxide semiconductor.

According to one embodiment of the present invention, the semiconductor device may include a resistor. A first terminal of the resistor may be electrically connected to the gate of the first insulated gate transistor. A second terminal of the resistor may be electrically connected to the third wiring.

In the semiconductor device according to one embodiment of the present invention, the concentration of hydrogen in the oxide semiconductor detected by secondary ion mass spectrometry may be $1 \times 10^{16}/cm^3$ or less.

In the semiconductor device according to one embodiment of the present invention, the carrier concentration of the oxide semiconductor may be less than $1 \times 10^{14}/cm^3$.

According to one embodiment of the present invention, the semiconductor device may include a buffer circuit. A potential of a node at which the gate of the fourth insulated gate transistor, the first terminal of the fifth insulated gate transistor, the first terminal of the sixth insulated gate transistor, the first electrode of the capacitor, and the gate of the eighth insulated gate transistor are electrically connected may be supplied to the gate of the ninth insulated gate transistor through the buffer circuit.

In the semiconductor device according to one embodiment of the present invention, the buffer circuit may include tenth to thirteenth insulated gate transistors. A gate of the tenth insulated gate transistor may be electrically connected to the first wiring. A first terminal of the tenth insulated gate transistor may be electrically connected to the second wiring. A second terminal of the tenth insulated gate transistor may be electrically connected to a first terminal of the eleventh insulated gate transistor and a gate of the thirteenth insulated gate transistor. A gate of the eleventh insulated gate transistor may be electrically connected to the gate of the fourth insulated gate transistor, the first terminal of the fifth insulated gate transistor, the first terminal of the sixth insulated gate transistor, the first electrode of the capacitor, and the gate of the eighth insulated gate transistor. A second terminal of the eleventh insulated gate transistor may be electrically connected to the third wiring. A gate of the twelfth insulated gate transistor may be electrically connected to the first wiring. A first terminal of the twelfth insulated gate transistor may be electrically connected to the second wiring. A second terminal of the twelfth insulated gate transistor may be electrically connected to a first terminal of the thirteenth insulated gate transistor and the gate of the ninth insulated gate transistor. A second terminal of the thirteenth insulated gate transistor may be electrically connected to the third wiring.

In the semiconductor device according to one embodiment of the present invention, the buffer circuit may include tenth to thirteenth insulated gate transistors. A gate of the tenth insulated gate transistor may be electrically connected to the gate of the second insulated gate transistor, the first terminal of the seventh insulated gate transistor, and the first terminal of the eighth insulated gate transistor. A first terminal of the tenth insulated gate transistor may be electrically connected to the second wiring. A second terminal of the tenth insulated gate transistor may be electrically connected to a first terminal of the eleventh insulated gate transistor and a gate of the thirteenth insulated gate transistor. A gate of the eleventh insulated gate transistor may be electrically connected to the gate of the fourth insulated gate transistor, the first terminal of the fifth insulated gate transistor, the first terminal of the sixth insulated gate transistor, the first electrode of the capacitor, the gate of the eighth insulated gate transistor, and a gate of the twelfth insulated gate transistor. A second terminal of the eleventh insulated gate transistor may be electrically connected to the third wiring. A first terminal of the twelfth insulated gate transistor may be electrically connected to the second wiring. A second terminal of the twelfth insulated gate transistor may be electrically connected to a first terminal of the thirteenth insulated gate transistor and the gate of the ninth insulated gate transistor. A second terminal of the thirteenth insulated gate transistor may be electrically connected to the third wiring.

In the semiconductor device according to one embodiment of the present invention, the first high power supply potential and the second high power supply potential may be the same.

According to one embodiment of the present invention, it is possible to provide a semiconductor device that has high withstanding voltage and can realize a function of a thyristor without complication of the process.

BEST MODE FOR CARRYING OUT THE INVENTION

Figure 1:
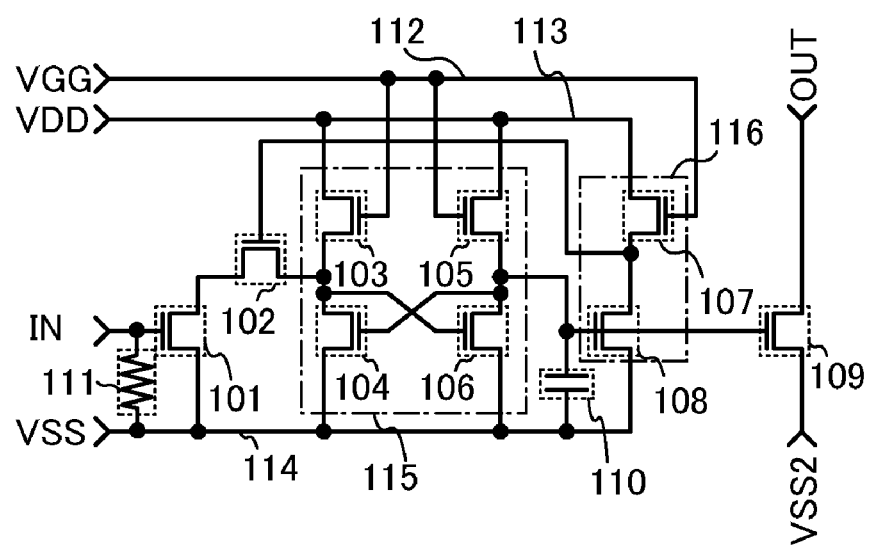
FIG. 1 illustrates a semiconductor device according to one embodiment of the present invention.

Embodiments of the present invention will be described below with reference to the accompanying drawings. Note that the present invention can be carried out in many different modes, and it is easily understood by those skilled in the art that modes and details of the present invention can be modified in various ways without departing from the spirit and the scope of the present invention. Therefore, the present invention is not interpreted as being limited to the description of the embodiments below. Note that in the following description of the present invention, reference numerals denoting identical portions are used in common in different drawings.

Note that the size, the thickness of a layer, or a region of each structure illustrated in drawings or the like in embodiments is exaggerated for simplicity in some cases. Therefore, embodiments of the present invention are not limited to such scales.

Note that terms such as first, second, third to Nth (N is a natural number) employed in this specification are used in order to avoid confusion between components and do not set a limitation on number.

Embodiment 1

In this embodiment, a circuit configuration of a semiconductor device will be described first with reference to FIG. 1, FIGS. 2A and 2B, FIGS. 3A to 3C, and FIGS. 4A to 4C, and then operation of the semiconductor device will be described.

In FIG. 1, A semiconductor device that is shown in this embodiment and has a function equivalent to that of a thyristor includes a first insulated gate transistor 101, a second insulated gate transistor 102, a third insulated gate transistor 103, a fourth insulated gate transistor 104, a fifth insulated gate transistor 105, a sixth insulated gate transistor 106, a seventh insulated gate transistor 107, an eighth insulated gate transistor 108, a ninth insulated gate transistor 109, a capacitor 110, and a resistor 111. Each of the elements included in the semiconductor device controls a current flowing between a first terminal and a second terminal of the ninth insulated gate transistor 109, with a trigger signal supplied to an input terminal IN, a first high power supply potential VGG supplied to a first wiring 112, a second high power supply potential VDD supplied to a second wiring 113, and a low power supply potential VSS (also referred to as a first low power supply potential) supplied to a third wiring 114. Note that the first to ninth insulated gate transistors included in the semiconductor device are n-channel insulated gate transistors.

A gate of the first insulated gate transistor 101 is connected to the input terminal IN. A first terminal of the first insulated gate transistor 101 is connected to the third wiring 114. A second terminal of the first insulated gate transistor 101 is connected to a first terminal of the second insulated gate transistor 102. A gate of the second insulated gate transistor 102 is connected to a first terminal of the seventh insulated gate transistor 107 and a first terminal of the eighth insulated gate transistor 108. A second terminal of the second insulated gate transistor 102 is connected to a first terminal of the third insulated gate transistor 103, a first terminal of the fourth insulated gate transistor 104, and a gate of the sixth insulated gate transistor 106. A gate of the third insulated gate transistor 103 is connected to the first wiring 112. A second terminal of the third insulated gate transistor 103 is connected to the second wiring 113. A gate of the fourth insulated gate transistor 104 is connected to a first terminal of the fifth insulated gate transistor 105, a first terminal of the sixth insulated gate transistor 106, a first electrode of the capacitor 110, a gate of the eighth insulated gate transistor 108, and a gate of the ninth insulated gate transistor 109. A second terminal of the fourth insulated gate transistor 104 is connected to the third wiring 114. A gate of the fifth insulated gate transistor 105 is connected to the first wiring 112. A second terminal of the fifth insulated gate transistor 105 is connected to the second wiring 113. A second terminal of the sixth insulated gate transistor 106 is connected to the third wiring 114. A gate of the seventh insulated gate transistor 107 is connected to the first wiring 112. A second terminal of the seventh insulated gate transistor 107 is connected to the second wiring 113. A second terminal of the eighth insulated gate transistor 108 is connected to the third wiring 114. The first terminal of the ninth insulated gate transistor 109 is connected to an output terminal OUT. The second terminal of the ninth insulated gate transistor 109 is connected to a terminal to which a second low power supply potential VSS2 is supplied. A second electrode of the capacitor 110 is connected to the third wiring 114.

Figure 2A:
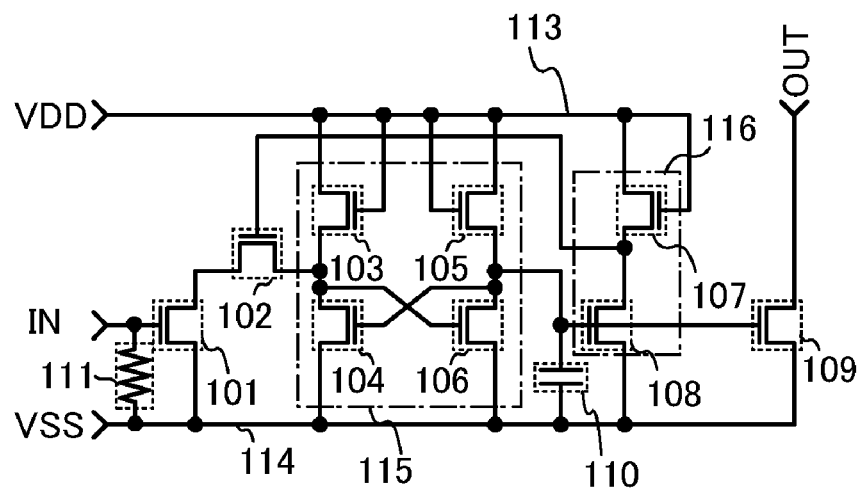
FIGS. 2A and 2B each illustrate a semiconductor device according to one embodiment of the present invention.

Inverter circuits are constituted by the third insulated gate transistor 103 and the fourth insulated gate transistor 104, and by the fifth insulated gate transistor 105 and the sixth insulated gate transistor 106. A static memory circuit 115 is constituted by a combination of the inverter circuits. Moreover, an inverter circuit 116 is constituted by the seventh insulated gate transistor 107 and the eighth insulated gate transistor 108. Therefore, the third insulated gate transistor 103, the fifth insulated gate transistor 105, and the seventh insulated gate transistor 107 included in the inverter circuits each function as a resistor through which a current flows from the second wiring 113 (also referred to as a constant current source for supplying a constant current). The second low power supply potential VSS2 supplied to the second terminal of the ninth insulated gate transistor 109 has a potential at which the ninth insulated gate transistor 109 is brought into conduction when a potential based on the second high power supply potential VDD is supplied to the gate of the ninth insulated gate transistor 109. The second low power supply potential VSS2 may be the low power supply potential VSS. In other words, the semiconductor device illustrated in FIG. 1 may have a structure where the first wiring 112 to which the first high power supply potential VGG is supplied is omitted and/or the terminal to which the second low power supply potential VSS2 is supplied is connected to the third wiring 114 to which the first low power supply potential VSS is supplied, as illustrated in FIG. 2A.

Figure 2B:
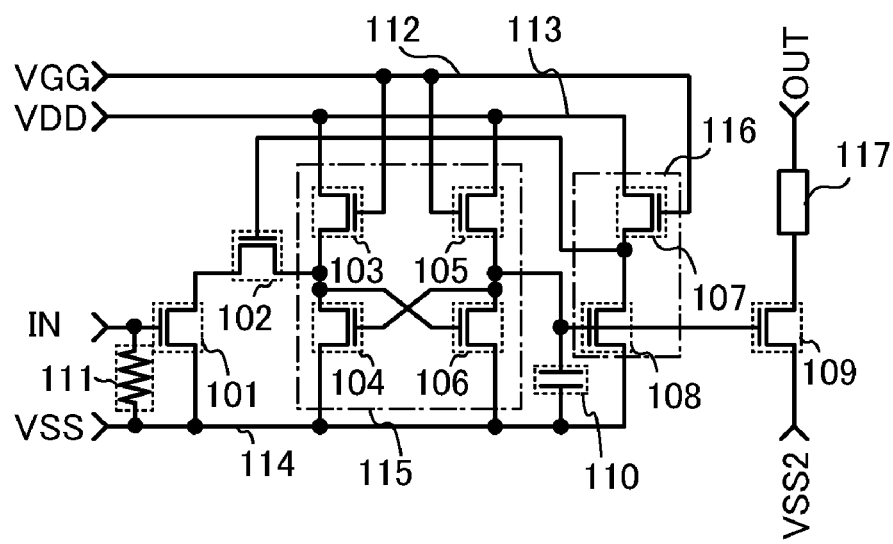

As illustrated in FIG. 2B, a load 117 may be connected to the output terminal OUT connected to the first terminal of the ninth insulated gate transistor 109. A current flows through the load when electrical continuity is established between the first terminal and the second terminal of the ninth insulated gate transistor 109.

In addition, the resistor 111 is provided between the input terminal IN and the third wiring 114. A first terminal of the resistor 111 is connected to the input terminal IN, and a second terminal of the resistor 111 is connected to the third wiring 114. The placement of the resistor 111 can prevent the first insulated gate transistor 101 from malfunctioning when a signal other than the trigger signal (e.g., noise) is input to the input terminal IN. The resistor 111 may be formed by leading a semiconductor layer in a meander shape (a serpentine manner).

The capacitor 110 is provided in order that the capacitance of a node on the first terminal side of the third insulated gate transistor 103 is different from the capacitance of a node on the first terminal side of the fifth insulated gate transistor 105. The capacitor 110 has a structure in which an insulating layer is sandwiched between conductors. Furthermore, the third insulated gate transistor 103 and the fifth insulated gate transistor 105 preferably have the same size.

Note that an oxide semiconductor is used for a semiconductor layer in each of the insulated gate transistors included in the semiconductor device. By the use of the oxide semiconductor for the semiconductor layer of the insulated gate transistor, the field-effect mobility can be made higher than that of the case where a silicon-based semiconductor material such as amorphous silicon is used. Unlike a thyristor that is formed with a combination of pn junctions in a single crystal semiconductor substrate, the insulated gate transistor in which an oxide semiconductor is used for the semiconductor layer is formed by stacking materials over a substrate. For that reason, restrictions on the size of a substrate and the like are eased and complication of the process is reduced in forming the semiconductor device. Note that examples of the oxide semiconductor are zinc oxide (ZnO) and tin oxide ($SnO_2$). Moreover, In, Ga, or the like can be added to ZnO.

Next, an oxide semiconductor layer used as a semiconductor layer in each insulated gate transistor in the structure of this embodiment will be described.

Hydrogen or an OH group contained in the oxide semiconductor used in this embodiment is removed from the oxide semiconductor so that the concentration of hydrogen in the oxide semiconductor is $1\times10^{16}/cm^3$ or less. The insulated gate transistor is formed in which a channel region is formed using an oxide semiconductor layer with a carrier concentration of less than $5\times10^{14}/cm^3$, preferably less than $1\times10^{12}/cm^3$, further preferably $1\times10^{11}/cm^3$ or less. Note that the hydrogen concentration in the oxide semiconductor layer is measured by secondary ion mass spectrometry (SIMS).

The energy gap is 2 eV or more, preferably 2.5 eV or more, further preferably 3 eV or more. The carrier concentration is set to less than $1\times10^{14}/cm^3$, preferably less than $1\times10^{12}/cm^3$, further preferably $1\times10^{11}/cm^3$ or less by reducing impurities to be donors, such as hydrogen, as much as possible. That is, the carrier concentration of the oxide semiconductor layer is made as close to zero as possible.

An insulated gate transistor in which an oxide semiconductor layer that is highly purified by a drastic reduction in hydrogen contained therein is used for a channel formation region can have an off-state current of $1\times10^{16}$ A or lower. In other words, the circuit can be designed with the oxide semiconductor layer that can be considered as an insulator when the insulated gate transistor is not conducting. Moreover, when the insulated gate transistor is conducting, the current supply capability of the oxide semiconductor layer is expected to be higher than that of a semiconductor layer formed of amorphous silicon.

Note that the off-state current in this specification refers to a current flowing between a source and a drain, that is, between a first terminal and a second terminal of an insulated gate transistor when the insulated gate transistor is not conducting (i.e., the insulated gate transistor is off). In the case of an n-channel insulated gate transistor, the off-state current refers to a current flowing between a source and a drain when a voltage applied between a gate and the source is equal to or lower than the threshold voltage (Vth).

Note that as the oxide semiconductor film, the following oxide semiconductor films can be used, for example: a four-component metal oxide film such as an In—Sn—Ga—Zn—O film; a three-component metal oxide film such as an In—Ga—Zn—O film, an In—Sn—Zn—O film, an In—Al—Zn—O film, a Sn—Ga—Zn—O film, an Al—Ga—Zn—O film, or a Sn—Al—Zn—O film; a two-component metal oxide film such as an In—Zn—O film, a Sn—Zn—O film, an Al—Zn—O film, a Zn—Mg—O film, a Sn—Mg—O film, or an In—Mg—O film; an In—O film, a Sn—O film, or a Zn—O film. Further, the oxide semiconductor film may contain $SiO_2$.

As the oxide semiconductor film, a thin film expressed by $InMO_3(ZnO)_m$ (m>0) can be used. Here, M represents one or more metal elements selected from Ga, Al, Mn, and Co. For example, M may be Ga, Ga and Al, Ga and Mn, Ga and Co, or the like. An oxide semiconductor whose composition formula is represented as $InMO_3(ZnO)_m$ (m>0) where at least Ga is included as M is referred to as an In—Ga—Zn—O oxide semiconductor, and a thin film of the In—Ga—Zn—O oxide semiconductor is referred to as an In—Ga—Zn—O film.

Note that the first high power supply potential VGG and the second high power supply potential VDD are signals with a potential higher than a reference potential, and the low power supply potential VSS and the second low power supply potential VSS2 are signals with a potential that is lower than or equal to the reference potential. It is preferable that the first high power supply potential VGG, the second high power supply potential VDD, the low power supply potential VSS, and the second low power supply potential VSS2 are such that an ideal insulated gate transistor (whose threshold voltage is 0 V) is turned on when a high power supply potential is applied to a gate and the ideal insulated gate transistor is turned off when a low power supply potential is applied to the gate.

Note that voltage refers to a potential difference between a given potential and a reference potential (e.g., a ground potential) in many cases. Therefore, voltage, potential, and potential difference can also be referred to as potential or voltage.

Note that the insulated gate transistor can have a variety of structures without being limited to a certain structure. For example, a multi-gate structure having two or more gate electrodes may be used.

Moreover, it is possible to employ a structure where gate electrodes are provided above and below a channel region. Note that when gate electrodes are formed above and below a channel region, it is possible to employ a structure where a plurality of insulated gate transistors are connected in parallel.

Note that when it is explicitly described that "A and B are connected", the case where A and B are electrically connected, the case where A and B are functionally connected, and the case where A and B are directly connected are included therein. Here, each of A and B is an object (e.g., a device, an element, a circuit, a wiring, an electrode, a terminal, a conductive film, or a layer). Therefore, another element may be provided between elements having a connection relation shown in drawings and texts, without limitation on a predetermined connection relation, for example, the connection relation shown in the drawings and the texts.

Next, operation of the semiconductor device that is illustrated in FIG. 1 and has a function equivalent to that of a thyristor will be described with reference to FIGS. 3A to 3C and FIGS. 4A to 4C. Note that in the description of FIGS. 3A to 3C and FIGS. 4A to 4C, a node A (A in the drawing) represents a node at which the second terminal of the second insulated gate transistor 102, the first terminal of the third insulated gate transistor 103, the first terminal of the fourth insulated gate transistor 104, and the gate of the sixth insulated gate transistor 106 are connected. In addition, in the description of FIGS. 3A to 3C and FIGS. 4A to 4C, a node B (B in the drawing) represents a node at which the gate of the fourth insulated gate transistor 104, the first terminal of the fifth insulated gate transistor 105, the first terminal of the sixth insulated gate transistor 106, the first electrode of the capacitor 110, the gate of the eighth insulated gate transistor 108, and the gate of the ninth insulated gate transistor 109 are connected.

Operation in which the power supply potentials are supplied to the first to third wirings 112 to 114 so that the node A and the node B are set to a predetermined potential will be described first. Note that this operation is also referred to as reset operation (or first operation).

Figure 3A:
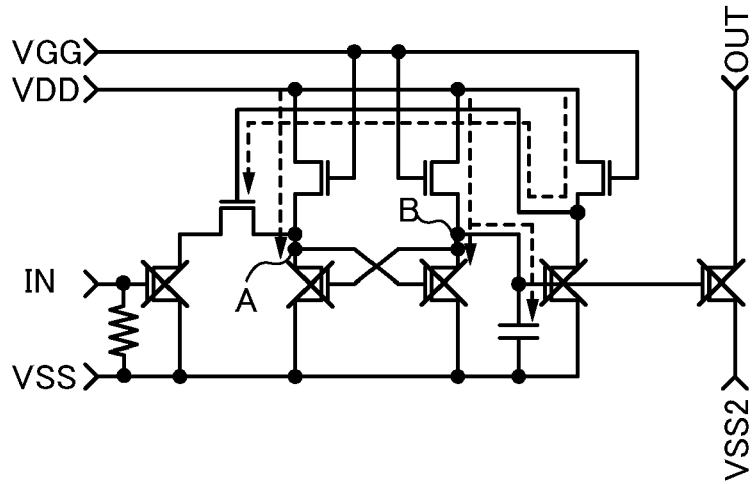
FIGS. 3A to 3C illustrate a semiconductor device according to one embodiment of the present invention.
Figure 3B:
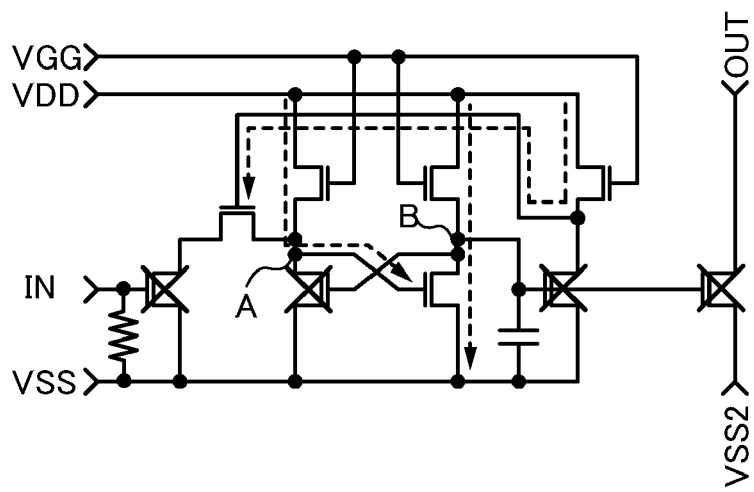
Figure 3C:
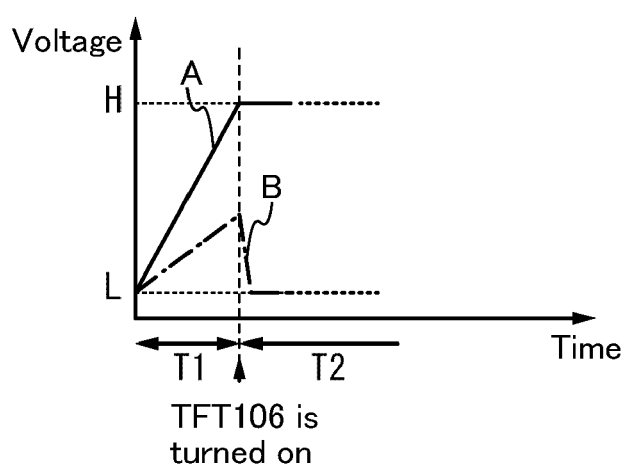
Figure 4A:
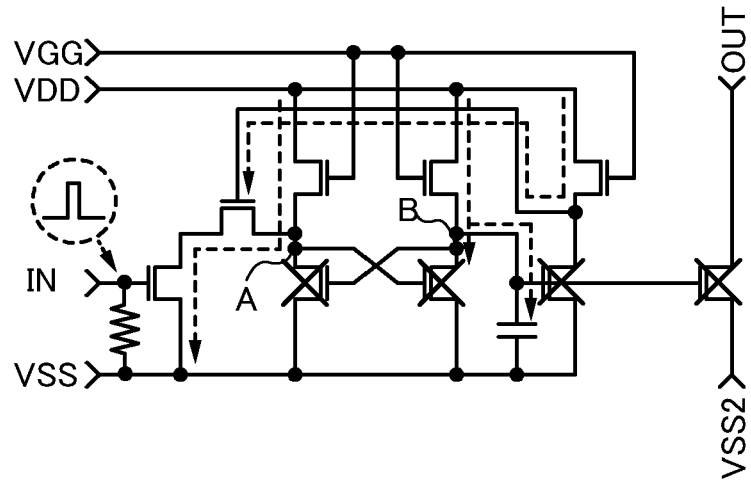
FIGS. 4A to 4C illustrate a semiconductor device according to one embodiment of the present invention.
Figure 4B:
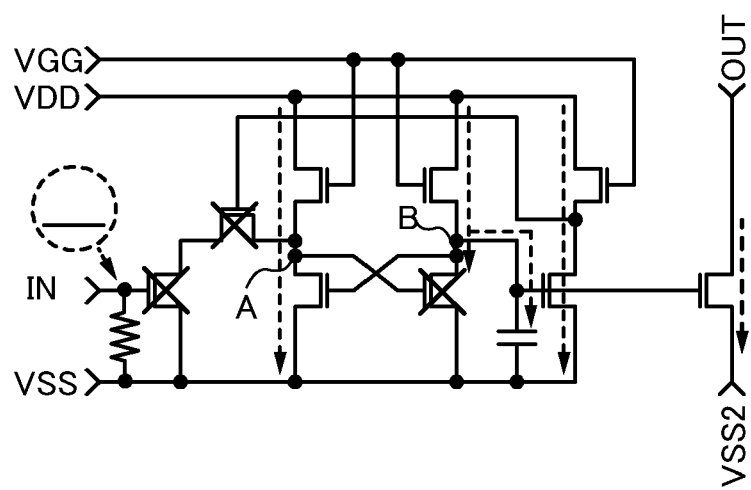
Figure 4C:
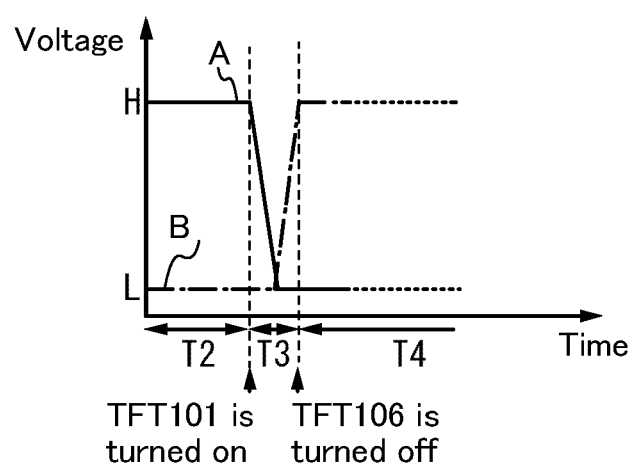

First, the first high power supply potential VGG, the second high power supply potential VDD, and the low power supply potential VSS are supplied to the first wiring 112, the second wiring 113, and the third wiring 114, respectively, so that current flows from the second wiring 113 through the third insulated gate transistor 103, the fifth insulated gate transistor 105, and the seventh insulated gate transistor 107 (see dotted arrows in FIG. 3A). Then, the potential of the node A is raised by the current flowing through the third insulated gate transistor 103. Moreover, the potential of the node B is raised by the current flowing through the fifth insulated gate transistor 105. Furthermore, the potential of the gate of the second insulated gate transistor 102 is raised by the current flowing through the seventh insulated gate transistor 107. Note that this operation corresponds to a first period T1 in FIG. 3C. FIG. 3C illustrates a change in potential over time; a solid line represents the potential of the node A and a dashed line represents the potential of the node B.

Note that in FIG. 3C, "H" represents a potential based on the second high power supply potential VDD supplied to the second wiring 113, and "L" represents a potential based on the low power supply potential VSS supplied to the third wiring 113.

As illustrated in FIG. 3C, the flow of the current in the first period T1 makes a difference between the slope of the rise in potential of the node A due to the current flowing through the third insulated gate transistor 103, and the slope of the rise in potential of the node B due to the current flowing through the fifth insulated gate transistor 105. When the third insulated gate transistor 103 and the fifth insulated gate transistor 105 have the same size as has been described above, the amount of current supplied is the same and yet the slope of the rise in potential of the node B is gentler than the slope of the rise in potential of the node A because the capacitor 110 is connected to the node B.

In addition, in the first period T1, the potential of the gate of the second insulated gate transistor 102 is raised by the current flowing through the seventh insulated gate transistor 107, and the second insulated gate transistor 102 is brought into conduction. Note that a trigger signal for turning on the first insulated gate transistor 101 is not input to the input terminal IN, so that the first insulated gate transistor 101 is brought out of conduction. Moreover, in the first period T1, the potentials of the node A and the node B are being raised, and the fourth, sixth, eighth, and ninth insulated gate transistors are brought out of conduction. For explanatory purposes, a cross (X) is placed on the insulated gate transistors in a non-conduction state in FIGS. 3A, 3B, 4A, and 4B.

Next, operation in which the potentials of the node A and the node B are raised so that a conduction state and a non-conduction state of the insulated gate transistors are changed will be described. Note that this operation is also referred to as initialization operation (or second operation).

As in the description of the first period T1, a difference occurs between the slope of the rise in potential of the node A and the slope of the rise in potential of the node B, whereby the node A is set to the potential "H" first. Thus, the sixth insulated gate transistor 106 is brought into conduction, and the potential of the node B is lowered to the potential "L" (see dotted arrows in FIG. 3B). Since the node B is set to the potential "L", the fourth insulated gate transistor 104, the eighth insulated gate transistor 108, and the ninth insulated gate transistor 109 are kept in a non-conduction state. Note that this operation corresponds to a second period T2 in FIG. 3C.

The flow of the current in the second period T2 determines a conduction state or a non-conduction state of the fourth insulated gate transistor 104 and the sixth insulated gate transistor 106 which control the potentials of the node A and the node B. Specifically, the potential "H" is kept at the node A and the potential "L" is kept at the node B. That is, the above potentials are held in the second period T2 as long as the first high power supply potential VGG, the second high power supply potential VDD, and the low power supply potential VSS are supplied from the first wiring 112, the second wiring 113, and the third wiring 114, respectively. Thus, the ninth insulated gate transistor 109 is kept in a non-conduction state. In the case where an oxide semiconductor is used for a semiconductor layer of an insulated gate transistor, the oxide semiconductor layer can be considered as an insulator when the insulated gate transistor is not conducting, and a current flowing from the output terminal OUT can be kept small.

In the second period T2, as in the first period T1, the potential of the gate of the second insulated gate transistor 102 is raised by the current flowing through the seventh insulated gate transistor 107, and the second insulated gate transistor 102 is brought into conduction. Note that a trigger signal for turning on the first insulated gate transistor 101 is not input to the input terminal IN, so that the first insulated gate transistor 101 is brought out of conduction.

Next, operation in which a conduction state and a non-conduction state of the insulated gate transistors are changed with a change in potentials of the node A and the node B at the time of input of a trigger signal from the input terminal IN will be described. Note that this operation is also referred to as trigger input operation (or third operation).

Note that the trigger signal is a pulse signal for turning on the first insulated gate transistor 101. Specifically, an H signal is input as the trigger signal in order that a current flows to the output terminal OUT of the semiconductor device functioning as a thyristor, that is, to the ninth insulated gate transistor 109. After a current flows to the output terminal OUT of the semiconductor device once, the output terminal OUT keeps current flowing even when the trigger signal is switched to an L signal as in a thyristor.

As in the description of the second period T2, the potential "H" is kept at the node A and the potential "L" is kept at the node B by the initialization operation. When the trigger signal is input from the input terminal IN at this state, the first insulated gate transistor 101 and the second insulated gate transistor 102 are brought into conduction and a current flows from the node A toward the third wiring 114 (see dotted arrows in FIG. 4A). That is, the potential of the node A is lowered, and the sixth insulated gate transistor 106 is brought out of conduction when the potential of the node A is lowered to the potential "L". Note that this operation corresponds to a third period T3 in FIG. 4C.

Then, operation in which a conduction state and a non-conduction state of the insulated gate transistors are changed in the case where the trigger signal input from the input terminal IN is an L signal will be described. Note that this operation is also referred to as holding operation (or fourth operation).

As in the description of the third period T3, the potential of the node A is lowered to the potential "L" and the sixth insulated gate transistor 106 is brought out of conduction by the trigger input operation. When the sixth insulated gate transistor 106 is brought out of conduction, the potential of the node B is increased from the potential "L" to the potential "H". Then, when the node B is set to the potential "H", the fourth insulated gate transistor 104 is brought into conduction, and a conduction state or a non-conduction state of the fourth insulated gate transistor 104 and the sixth insulated gate transistor 106 which control the potentials of the node A and the node B is determined (see dotted arrows in FIG. 4B). Thus, the fourth insulated gate transistor 104, the eighth insulated gate transistor 108, and the ninth insulated gate transistor 109 are brought into conduction. Note that this operation corresponds to a fourth period T4 in FIG. 4C.

Note that in the fourth period T4, the trigger signal is an L signal and the first insulated gate transistor 101 is brought out of conduction. Moreover, in the fourth period T4, the eighth insulated gate transistor 108 is brought into conduction, so that the potential of the gate of the second insulated gate transistor 102 is lowered and the second insulated gate transistor 102 is brought out of conduction.

With the above-described operation, the ninth insulated gate transistor 109 is kept in a conduction state. Note that although depending on the amount of current flowing from the output terminal OUT, it is preferable to design so that the semiconductor layer in the ninth insulated gate transistor 109 has a larger width than the semiconductor layers in the first to eighth insulated gate transistors in order to increase the amount of current flowing through the ninth insulated gate transistor 109. It is preferable to use an oxide semiconductor layer because the current supply capability at the time when the insulated gate transistor is conducting is expected to be higher than that of a semiconductor layer formed of amorphous silicon.

In order that the ninth insulated gate transistor 109 is brought into conduction and then brought out of conduction again, the supply of the power supply potentials to the first to third wirings 112 to 114 is stopped. This operation is referred to as stop operation. In order to operate the semiconductor device again, a series of the above-described operation can be performed again as the reset operation.

Note that what is described in this embodiment with reference to each drawing can be freely combined or replaced with what is described in other embodiments as appropriate.

Embodiment 2

In this embodiment, a circuit configuration of a semiconductor device will be described with reference to FIGS. 5A and 5B. This embodiment shows a structure obtained in the following manner: in the structure of Embodiment 1, a buffer circuit is provided between the gate of the ninth insulated gate transistor 109 and the node at which the gate of the fourth insulated gate transistor 104, the first terminal of the fifth insulated gate transistor 105, the first terminal of the sixth insulated gate transistor 106, the first electrode of the capacitor 110, and the gate of the eighth insulated gate transistor 108 are electrically connected. Note that description of portions similar to those in Embodiment 1, such as the operation of the semiconductor device, is not repeated.

Figure 5A:
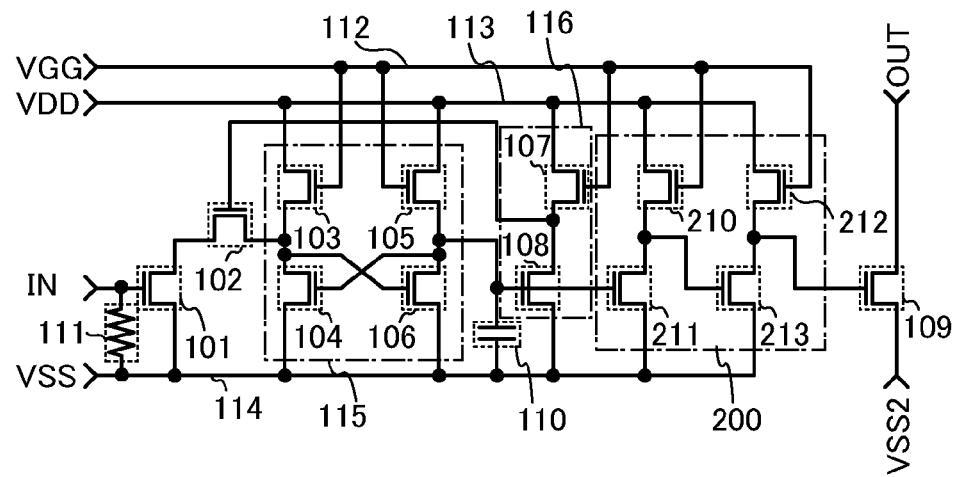
FIGS. 5A and 5B each illustrate a semiconductor device according to one embodiment of the present invention.

A semiconductor device which is illustrated in FIG. 5A and has a function equivalent to that of a thyristor is different from the semiconductor device in FIG. 1 of Embodiment 1 in that it includes a buffer circuit 200. The buffer circuit 200 illustrated in FIG. 5A includes a tenth insulated gate transistor 210, an eleventh insulated gate transistor 211, a twelfth insulated gate transistor 212, and a thirteenth insulated gate transistor 213. A gate of the tenth insulated gate transistor 210 is connected to the first wiring 112. A first terminal of the tenth insulated gate transistor 210 is connected to the second wiring 113. A second terminal of the tenth insulated gate transistor 210 is connected to a first terminal of the eleventh insulated gate transistor 211 and a gate of the thirteenth insulated gate transistor 213. A gate of the eleventh insulated gate transistor 211 is connected to the gate of the fourth insulated gate transistor 104, the first terminal of the fifth insulated gate transistor 105, the first terminal of the sixth insulated gate transistor 106, the first electrode of the capacitor 110, and the gate of the eighth insulated gate transistor 108. A second terminal of the eleventh insulated gate transistor 211 is connected to the third wiring 114. A gate of the twelfth insulated gate transistor 212 is connected to the first wiring 112. A first terminal of the twelfth insulated gate transistor 212 is connected to the second wiring 113. A second terminal of the twelfth insulated gate transistor 212 is connected to a first terminal of the thirteenth insulated gate transistor 213 and the gate of the ninth insulated gate transistor 109. A second terminal of the thirteenth insulated gate transistor 213 is connected to the third wiring 114.

The buffer circuit has a structure in which an even number of inverter circuits such as the inverter circuits 116 (two inverter circuits in FIG. 5A) are combined as illustrated in FIG. 5A, whereby the current supply capability is expected to improve by a sequential increase in size of the insulated gate transistors, and the amount of current flowing to the output terminal OUT can be increased by the increase in size of the ninth insulated gate transistor 109.

Figure 5B:
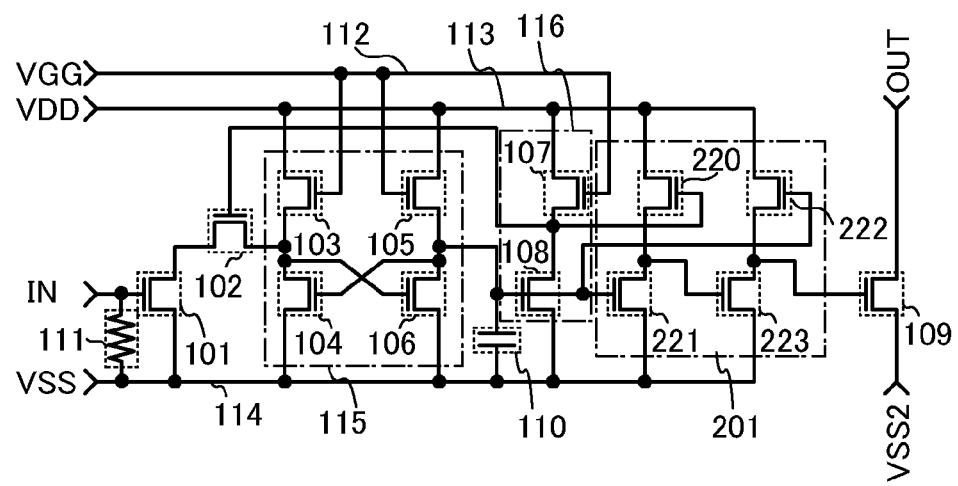

FIG. 5B illustrates a structure of a semiconductor device including a buffer circuit 201 with a structure different from that in FIG. 5A. The buffer circuit 201 illustrated in FIG. 5B includes a tenth insulated gate transistor 220, an eleventh insulated gate transistor 221, a twelfth insulated gate transistor 222, and a thirteenth insulated gate transistor 223. A gate of the tenth insulated gate transistor 220 is connected to the gate of the second insulated gate transistor 102, the first terminal of the seventh insulated gate transistor 107, and the first terminal of the eighth insulated gate transistor 108. A first terminal of the tenth insulated gate transistor 220 is connected to the second wiring 113. A second terminal of the tenth insulated gate transistor 220 is connected to a first terminal of the eleventh insulated gate transistor 221 and a gate of the thirteenth insulated gate transistor 223. A gate of the eleventh insulated gate transistor 221 is connected to the gate of the fourth insulated gate transistor 104, the first terminal of the fifth insulated gate transistor 105, the first terminal of the sixth insulated gate transistor 106, the first electrode of the capacitor 110, the gate of the eighth insulated gate transistor 108, and a gate of the twelfth insulated gate transistor 222. A second terminal of the eleventh insulated gate transistor 221 is connected to the third wiring 114. A first terminal of the twelfth insulated gate transistor 222 is connected to the second wiring 113. A second terminal of the twelfth insulated gate transistor 222 is connected to a first terminal of the thirteenth insulated gate transistor 223 and the gate of the ninth insulated gate transistor 109. A second terminal of the thirteenth insulated gate transistor 223 is connected to the third wiring 114.

Unlike in an inverter circuit such as the inverter circuit 116, in the buffer circuit 201 in FIG. 5B, it is possible to shorten a period during which both the tenth insulated gate transistor 220 and the eleventh insulated gate transistor 221 are conducting and a period during which both the twelfth insulated gate transistor 222 and the thirteenth insulated gate transistor 223 are conducting, and it is possible to reduce a current flowing from the second wiring 113 to the third wiring 114 in the holding operation.

Note that what is described in this embodiment with reference to each drawing can be freely combined or replaced with what is described in other embodiments as appropriate.

Embodiment 3

In this embodiment, a structure of an insulated gate transistor used as the insulated gate transistor in Embodiments 1 and 2 will be described with reference to FIGS. 6A and 6B.

Figure 6A:
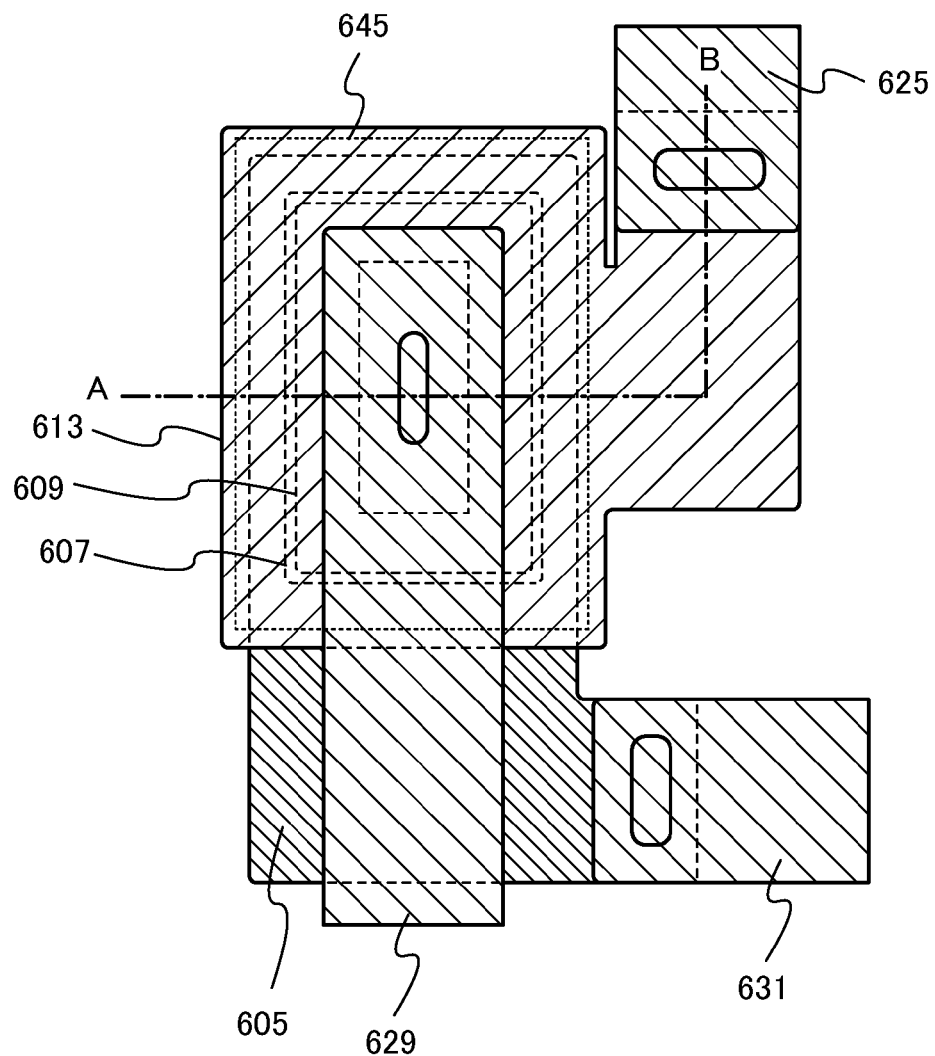
FIGS. 6A and 6B illustrate a semiconductor device according to one embodiment of the present invention.

FIG. 6A is a top view of an insulated gate transistor 645. FIG. 6B corresponds to a cross-sectional view along dashed line A-B in FIG. 6A.

Figure 6B:
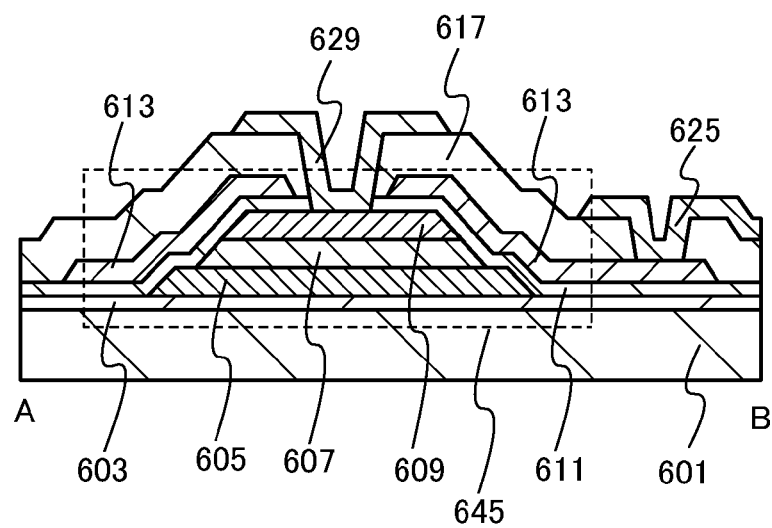

As illustrated in FIG. 6B, a first electrode 605, an oxide semiconductor film 607, and a second electrode 609 are stacked over an insulating film 603 formed over a substrate 601. A gate insulating film 611 is provided so as to cover the first electrode 605, the oxide semiconductor film 607, and the second electrode 609. A third electrode 613 is provided over the gate insulating film 611. An insulating film 617 functioning as an interlayer insulating film is provided over the gate insulating film 611 and the third electrode 613. Opening portions are formed in the insulating film 617. A wiring 631 (see FIG. 6A), a wiring 629, and a wiring 625 that are connected to the first electrode 605, the second electrode 609, and the third electrode 613, respectively, through the respective opening portions are formed.

The first electrode 605 functions as one of a source electrode and a drain electrode of the insulated gate transistor 645. The second electrode 609 functions as the other of the source electrode and the drain electrode of the insulated gate transistor 645. The third electrode 613 functions as a gate electrode of the insulated gate transistor 645.

In this embodiment, the third electrode 613 functioning as the gate electrode is ring-shaped. When the third electrode 613 functioning as the gate electrode has a ring shape, the channel width of the insulated gate transistor can be increased. Thus, the amount of current flowing through the insulated gate transistor can be increased.

The substrate 601 needs to have heat resistance at least high enough to withstand heat treatment to be performed later. As the substrate 601, a glass substrate of barium borosilicate glass, aluminoborosilicate glass, or the like can be used.

When the temperature of heat treatment to be performed later is high, a glass substrate whose strain point is 730° C. or higher is preferably used. For the glass substrate, a glass material such as aluminosilicate glass, aluminoborosilicate glass, or barium borosilicate glass is used, for example. In general, more practical glass with heat resistance can be obtained when it contains a larger amount of barium oxide (BaO) than boron oxide ($B_2O_3$). Therefore, a glass substrate in which the amount of BaO is larger than that of $B_2O_3$ is preferably used.

Note that a substrate formed of an insulator, such as a ceramic substrate, a quartz substrate, or a sapphire substrate, may be used instead of the glass substrate. Alternatively, crystallized glass or the like can be used.

The insulating film 603 is formed using an oxide insulating film such as a silicon oxide film or a silicon oxynitride film; or a nitride insulating film such as a silicon nitride film, a silicon nitride oxide film, an aluminum nitride film, or an aluminum nitride oxide film. The insulating film 603 may have a layered structure, and for example, can have a layered structure in which one or more of the above nitride insulating films and one or more of the above oxide insulating films are stacked in this order from the substrate 601 side.

The first electrode 605 and the second electrode 609 are formed using a metal material such as Al, Cu, Cr, Ta, Ti, Mo, or W; an alloy material containing any of the metal materials; or the like. Moreover, the first electrode 605 and the second electrode 609 may have a structure in which a refractory metal layer of Cr, Ta, Ti, Mo, W, or the like is stacked on one or both of a top surface and a bottom surface of a metal layer of Al, Cu, or the like. Furthermore, heat resistance can be increased with the use of an aluminum material to which an element that prevents hillocks and whiskers from being generated in an aluminum film (e.g., Si, Ti, Ta, W, Mo, Cr, Nd, Sc, or Y). In addition, the first electrode 605 can have a single-layer structure or a layered structure including two layers or more. For example, the first electrode 605 can have a single-layer structure of an aluminum film containing silicon; a two-layer structure in which a titanium film is stacked over an aluminum film; a two-layer structure in which a titanium film is stacked over a tungsten film; or a three-layer structure in which a titanium film, an aluminum film, and a titanium film are stacked in this order. Alternatively, the first electrode 605 may be formed using a film, an alloy film, or a nitride film that contains aluminum and one or a plurality of elements selected from titanium, tantalum, tungsten, molybdenum, chromium, neodymium, and scandium.

The first electrode 605 and the second electrode 609 may be formed using conductive metal oxide. As the conductive metal oxide, indium oxide ($In_2O_3$), tin oxide ($SnO_2$), zinc oxide (ZnO), an alloy of indium oxide and tin oxide ($In_2O_3$—$SnO_2$, referred to as ITO), an alloy of indium oxide and zinc oxide ($In_2O_3$—ZnO), or a metal oxide material added with silicon or silicon oxide can be used.

As the oxide semiconductor film 607, the following oxide semiconductor films can be used, for example: a four-component metal oxide film such as an In—Sn—Ga—Zn—O film; a three-component metal oxide film such as an In—Ga—Zn—O film, an In—Sn—Zn—O film, an In—Al—Zn—O film, a Sn—Ga—Zn—O film, an Al—Ga—Zn—O film, or a Sn—Al—Zn—O film; a two-component metal oxide film such as an In—Zn—O film, a Sn—Zn—O film, an Al—Zn—O film, a Zn—Mg—O film, a Sn—Mg—O film, or an In—Mg—O film; an In—O film, a Sn—O film, or a Zn—O film. Further, the oxide semiconductor film may contain $SiO_2$.

As the oxide semiconductor film 607, a thin film expressed by $InMO_3(ZnO)_m$ (m>0) can be used. Here, M represents one or more metal elements selected from Ga, Al, Mn, and Co. For example, M may be Ga, Ga and Al, Ga and Mn, Ga and Co, or the like. An oxide semiconductor whose composition formula is represented as $InMO_3(ZnO)_m$ (m>0) where at least Ga is included as M is referred to as an In—Ga—Zn—O oxide semiconductor, and a thin film of the In—Ga—Zn—O oxide semiconductor is referred to as an In—Ga—Zn—O film.

The concentration of hydrogen contained in the oxide semiconductor film 607 used in this embodiment is $5\times10^{19}/cm^3$ or less, preferably $5\times10^{18}/cm^3$ or less, further preferably $5\times10^{17}/cm^3$ or less, which means that hydrogen contained in the oxide semiconductor film has been reduced. In other words, the oxide semiconductor film 607 is highly purified so as to contain an impurity other than the main component of the oxide semiconductor film as little as possible. Moreover, the carrier concentration of the oxide semiconductor film 607 is $5\times10^{14}/cm^3$ or less, preferably $1\times10^{14}/cm^3$ or less, further preferably $5\times10^{12}/cm^3$ or less, and much preferably $1\times10^{12}/cm^3$ or less. That is, the carrier concentration of the oxide semiconductor film is as close to zero as possible. The energy gap is 2 eV or more, preferably 2.5 eV or more, further preferably 3 eV or more. Note that the hydrogen concentration in the oxide semiconductor film can be detected by secondary ion mass spectrometry (SIMS). The carrier concentration can be measured by Hall effect measurement.

The oxide semiconductor film 607 preferably has a thickness of 30 nm to 3000 nm. The channel length of an insulated gate transistor can be shortened by when the thickness of the oxide semiconductor film 607 is reduced, and an insulated gate transistor with large on-state current and high field-effect mobility can be manufactured. On the other hand, when the oxide semiconductor film 607 has a large thickness, typically a thickness of 100 nm to 3000 nm, a semiconductor device for high-power application can be manufactured.

The gate insulating film 611 can be formed with a single-layer structure or a layered structure using a silicon oxide film, a silicon nitride film, a silicon oxynitride film, a silicon nitride oxide film, and/or an aluminum oxide film. Part of the gate insulating film 611 that is in contact with the oxide semiconductor film 607 preferably contains oxygen, and it is particularly preferable to form the gate insulating film 611 using a silicon oxide film. With the use of a silicon oxide film, oxygen can be supplied to the oxide semiconductor film 607, so that properties of the oxide semiconductor film 607 can be made favorable.

When the gate insulating film 611 is formed using a high-k material such as hafnium silicate (HfSiOx), HfSiOxNy obtained by addition of N, hafnium aluminate (HfAlOx), hafnium oxide, or yttrium oxide, the gate leakage current can be reduced. Moreover, the gate insulating film 611 can have a layered structure including a film of a high-k material and at least one of a silicon oxide film, a silicon nitride film, a silicon oxynitride film, a silicon nitride oxide film, and an aluminum oxide film. The gate insulating film 611 preferably has a thickness of 50 nm to 500 nm. When the thickness of the gate insulating film 611 is small, an insulated gate transistor with high field-effect mobility can be manufactured; thus a driver circuit can be formed over the substrate where the insulated gate transistor is formed. On the other hand, when the thickness of the gate insulating film 611 is large, the gate leakage current can be reduced.

The third electrode 613 functioning as the gate electrode can be formed using an element selected from aluminum, chromium, copper, tantalum, titanium, molybdenum, and tungsten; an alloy including any of these elements as a component; an alloy film including a combination of any of these elements; and the like. One or more materials selected from manganese, magnesium, zirconium, and beryllium may be used. The third electrode 613 can have a single-layer structure or a layered structure including two layers or more. For example, the third electrode 613 can have a single-layer structure of an aluminum film containing silicon; a two-layer structure in which a titanium film is stacked over an aluminum film; or a three-layer structure in which a titanium film, an aluminum film, and a titanium film are stacked in this order. Alternatively, the third electrode 613 may be formed using a film, an alloy film, or a nitride film that contains aluminum and one or a plurality of elements selected from titanium, tantalum, tungsten, molybdenum, chromium, neodymium, and scandium.

Next, operation of the insulated gate transistor including the oxide semiconductor film 607 will be described with reference to FIG. 7, FIGS. 8A and 8B, FIGS. 9A to 9C and FIG. 10.

Figure 7:
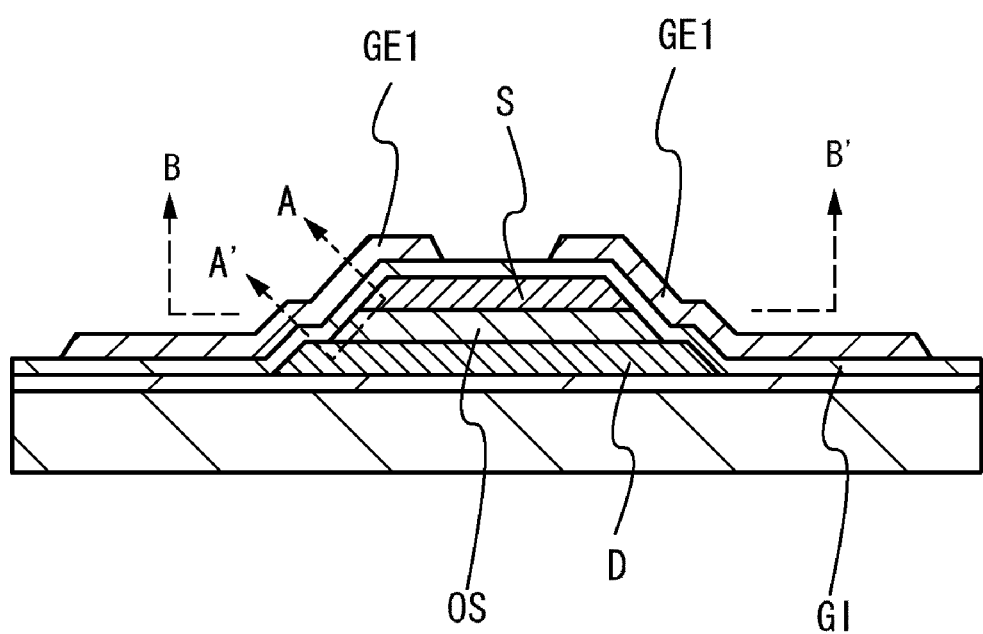
FIG. 7 illustrates a semiconductor device according to one embodiment of the present invention.

FIG. 7 is a cross-sectional view of an insulated gate transistor including an oxide semiconductor film shown in this embodiment. An oxide semiconductor film (OS) and a source electrode (S) are stacked over a drain electrode (D). A gate insulating film (GI) is provided over the drain electrode, the oxide semiconductor film, and the source electrode, and separate gate electrodes (GE1) are provided thereover.

Figure 8A:
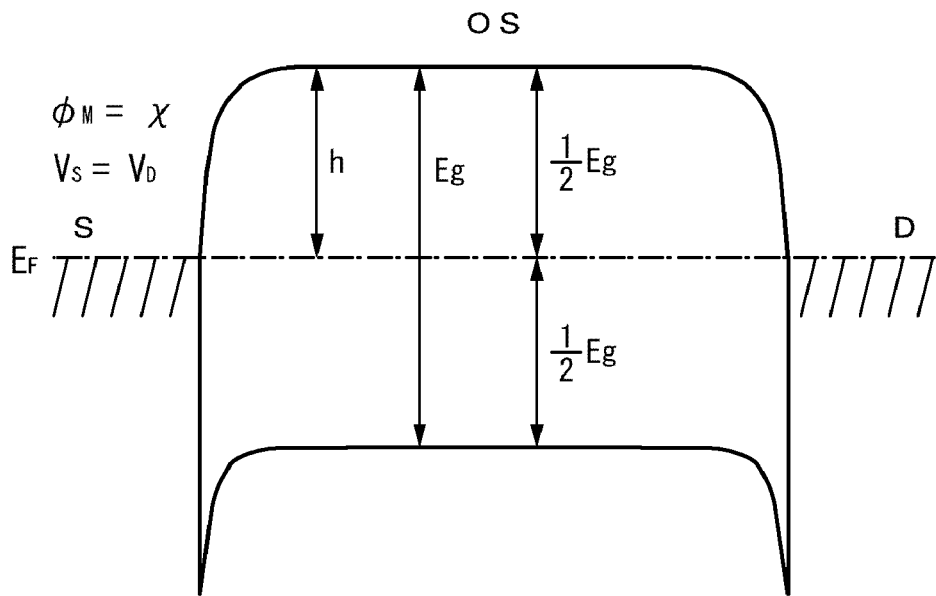
FIGS. 8A and 8B illustrate a semiconductor device according to one embodiment of the present invention.
Figure 8B:
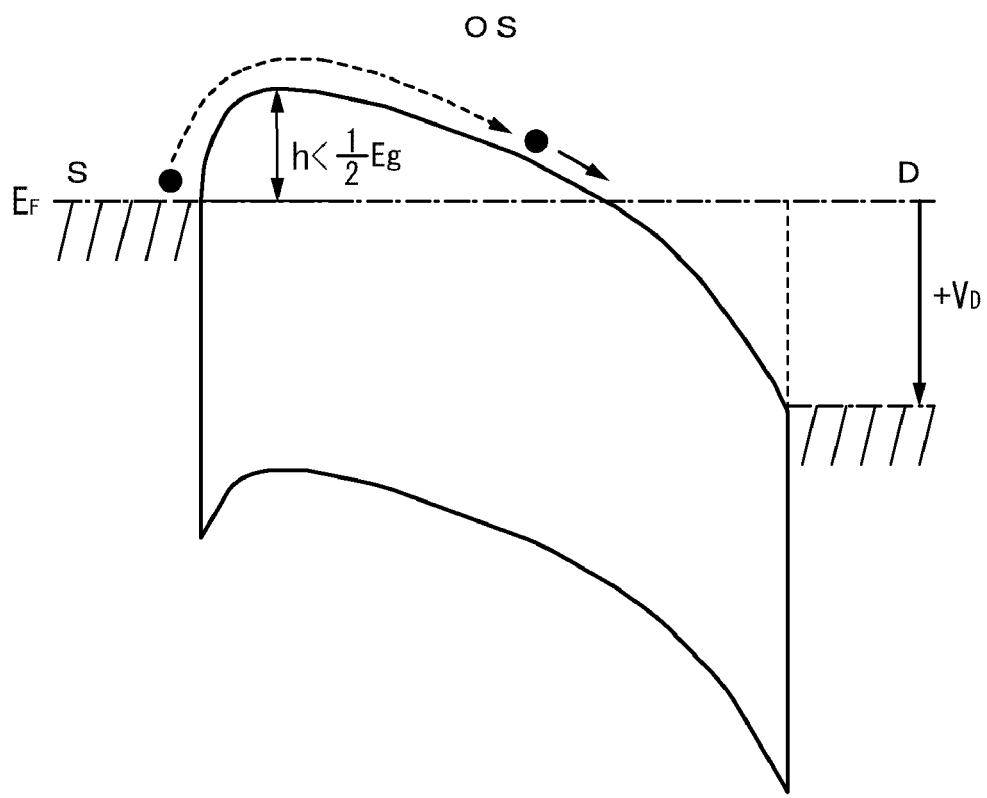

FIGS. 8A and 8B are energy band diagrams (schematic diagrams) of the cross section A-A' in FIG. 7. FIG. 8A illustrates the case where the voltage of the source and that of the drain are equal ($V_D$=0 V). FIG. 8B illustrates the case where a positive potential ($V_D$>0) with respect to a voltage of the source is applied to the drain.

Figure 9A:
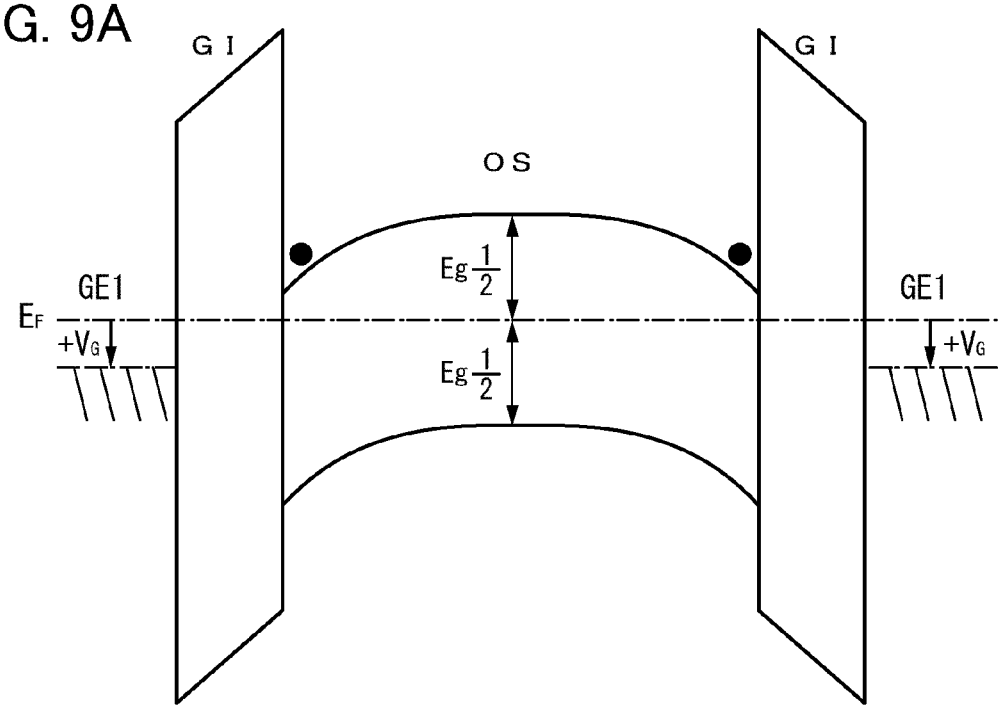
FIGS. 9A and 9B illustrate a semiconductor device according to one embodiment of the present invention.
Figure 9B:
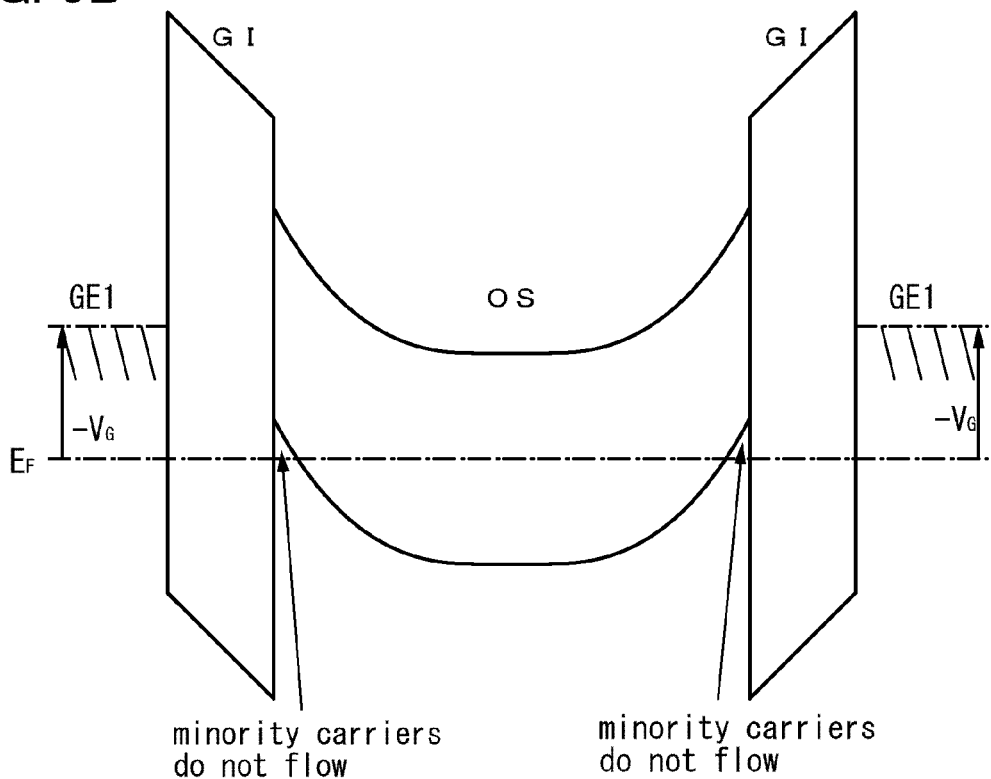

FIGS. 9A and 9B are energy band diagrams (schematic diagrams) of the cross section B-B' in FIG. 7. FIG. 9A illustrates a state where a positive potential (+$V_G$) is applied to the gate (GE1), that is, an on state (a conduction state) where carriers (electrons) flow between the source and the drain. FIG. 9B illustrates a state where a negative potential (−$V_G$) is applied to the gate (GE1), that is, an off state (a non-conduction state, a state where minority carriers do not flow).

Figure 10:
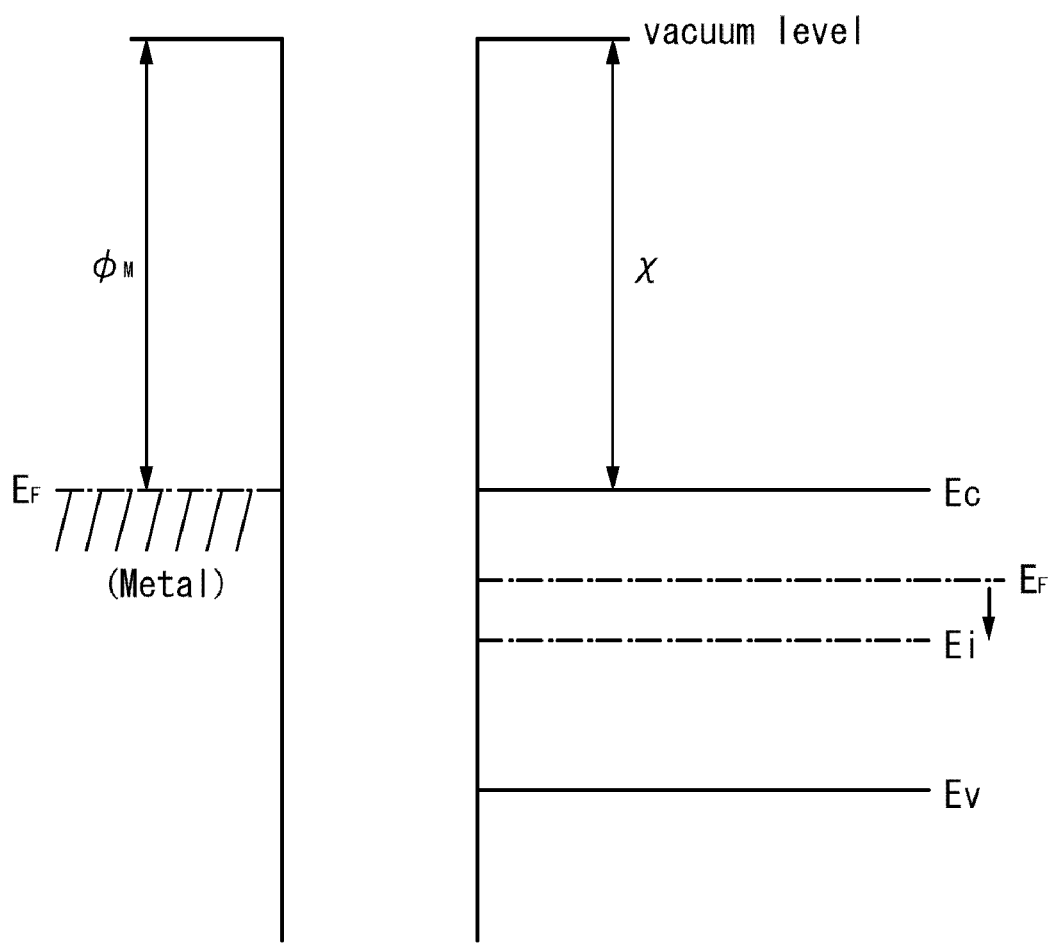
FIG. 10 illustrates a semiconductor device according to one embodiment of the present invention.

FIG. 10 illustrates the relation between the vacuum level, the work function ($\phi_M$) of a metal, and the electron affinity ($\chi$) of an oxide semiconductor film.

The metal degenerates, and the Fermi level is located in the conduction band. On the other hand, a conventional oxide semiconductor film is generally an n-type semiconductor film. The Fermi level ($E_f$) in that case is distant from the intrinsic Fermi level ($E_i$) at the center of the band gap and is located near the conduction band. Note that it is known that part of hydrogen in the oxide semiconductor film serves as a donor, which is one of the factors that make the oxide semiconductor have n-type conductivity.

In contrast, the oxide semiconductor film according to this embodiment is an intrinsic (an i-type) oxide semiconductor film obtained in the following manner: hydrogen, which is an n-type impurity, is removed from the oxide semiconductor film for high purification so that the oxide semiconductor film contains an impurity element other than its main element as little as possible. In other words, the oxide semiconductor film according to this embodiment is a highly purified i-type (intrinsic) semiconductor film or a substantially intrinsic semiconductor film obtained by removing impurities such as hydrogen, water, a hydroxyl group, or hydride as much as possible, not by adding an impurity element. Thus, the Fermi level ($E_f$) can be the same as the intrinsic Fermi level ($E_i$).

The electron affinity ($\chi$) of the oxide semiconductor film is said to be 4.3 eV in the case where the band gap ($E_g$) is 3.15 eV. The work function of titanium (Ti) included in the source electrode and the drain electrode is substantially equal to the electron affinity ($\chi$) of the oxide semiconductor. In this case, the Schottky barrier for electrons is not formed at the interface between the metal and the oxide semiconductor film.

That is to say, in the case where the work function ($\phi_M$) of the metal is equal to the electron affinity ($\chi$) of the oxide semiconductor film and the metal and the oxide semiconductor film are in contact with each other, an energy band diagram (a schematic diagram) illustrated in FIG. 8A is obtained.

In FIG. 8B, a black dot (•) indicates an electron. When a positive potential is applied to the drain, the electron crosses over a barrier (h) and is injected into the oxide semiconductor film, and flows toward the drain. In this case, the height of the barrier (h) changes depending on the gate voltage and drain voltage. When a positive drain voltage is applied, the height of the barrier is smaller than that of the barrier in FIG. 8A where no voltage is applied, that is, smaller than ½ of the band gap ($E_g$).

At this time, as illustrated in FIG. 9A, the electron moves along the lowest part on the oxide semiconductor film side, which is energetically stable, at the interface between the gate insulating film and the highly purified oxide semiconductor film.

In FIG. 9B, when a negative potential is applied to the gate electrode (GE1), a hole which is a minority carrier does not exist substantially, so that the current value is substantially close to zero.

For example, even in an insulated gate transistor with a channel width W of 1×10$^4$ μm and a channel length L of 3 μm, the off-state current at room temperature can be 1×10$^{-13}$ A or less, which is extremely low, and the subthreshold swing (S value) can be 0.1 V/dec (with a 100-nm-thick gate insulating layer).

The oxide semiconductor film is highly purified as described above so as to contain an impurity (typically, hydrogen, water, a hydroxyl group, or hydride) other than its main element as little as possible, so that the insulated gate transistor can operate in a favorable manner. In particular, the off-state current can be decreased.

In a lateral insulated gate transistor in which a channel is formed substantially parallel to a substrate, a source and a drain need to be provided in addition to the channel. For that reason, the area of the substrate occupied by the lateral insulated gate transistor is increased, which prevents microfabrication. In contrast, in a vertical insulated gate transistor, a source, a channel, and a drain are stacked, so that the area occupying the surface of a substrate can be reduced. Thus, the insulated gate transistor can be miniaturized.

In addition, the channel length of a vertical insulated gate transistor can be controlled by the thickness of an oxide semiconductor film; therefore, the insulated gate transistor can have a smaller channel length by a reduction in thickness of the oxide semiconductor film 607. The series resistance of the source, the channel, and the drain can be reduced by the reduction in channel length, whereby the on-state current and field-effect mobility of the insulated gate transistor can be increased. Moreover, the gate electrode of the insulated gate transistor in this embodiment is ring-shaped and the channel width can be increased, so that the on-state current can be increased. Furthermore, the insulated gate transistor including a highly purified oxide semiconductor film with a reduced concentration of hydrogen has an extremely low off-state current, and thus is set in an insulating state, in which almost no current flows, when the insulated gate transistor is off. Accordingly, even when the thickness of the oxide semiconductor film is reduced so that the channel length of the vertical insulated gate transistor is reduced, the insulated gate transistor has almost no off-state current in a non-conduction state.

With the use of a highly purified oxide semiconductor film whose hydrogen concentration is reduced as described above, it is possible to manufacture an insulated gate transistor that operates at high speed, can flow a large amount of current when the transistor is on, and flows almost no current when the transistor is off.

Note that what is described in this embodiment with reference to each drawing can be freely combined or replaced with what is described in other embodiments as appropriate.

Embodiment 4

In this embodiment, applications of the semiconductor device that is described in any of the above embodiments and functions as a thyristor will be described. The semiconductor device described in the above embodiment can be used, for example, for a battery power conditioner in an electronic device such as a display that can display images, for example, a computer; and a power conditioner provided for an electromagnetic cooker or a vehicle (e.g., a bicycle) that is driven with power from a fixed power source.

Note that a power conditioner refers to a device that supplies current to a load with a predetermined trigger signal.

Application examples of a power conditioner including the semiconductor device will be described with reference to FIGS. 11A to 11C.

Figure 11A:
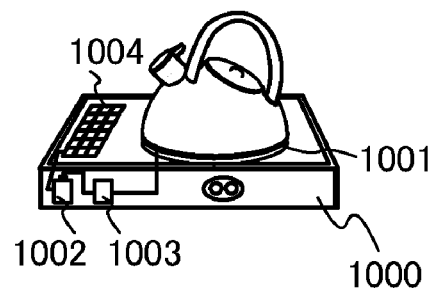
FIGS. 11A to 11C each illustrate an application example of a semiconductor device.

FIG. 11A illustrates an electromagnetic cooker 1000 as an application example of a power conditioner including the semiconductor device. The electromagnetic cooker 1000 heats a cooking device and the like by using electromagnetic induction generated by current flowing through a coil unit 1001. Moreover, the electromagnetic cooker 1000 includes a battery 1002 and a power conditioner 1003 for supplying current that is to flow through the coil unit 1001, and a solar battery 1004 for charging the battery 1002. Note that FIG. 11A illustrates the solar battery 1004 as a means to charge the battery 1002; alternatively, the battery 1002 may be charged by another means. Since the power conditioner 1003 including the semiconductor device functioning as a thyristor includes an insulated gate transistor including an oxide semiconductor layer, the off-state current can be reduced, and it is possible to achieve a reduction in power consumption when the electromagnetic cooker 1000 does not perform heating.

Figure 11B:
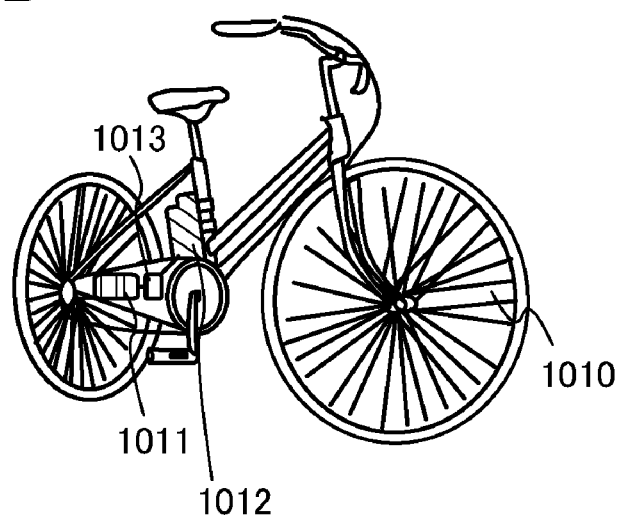

FIG. 11B illustrates an electric bicycle 1010 as an application example of a power conditioner including the semiconductor device. The electric bicycle 1010 obtains power when current flows through a motor unit 1011. Moreover, the electric bicycle 1010 includes a battery 1012 and a power conditioner 1013 for supplying current that is to flow through the motor unit 1011. Note that a means to charge the battery 1012 is not illustrated in FIG. 11B; the battery 1012 may be charged by an electric generator or the like that is additionally provided. Since the power conditioner 1013 including the semiconductor device functioning as a thyristor includes an insulated gate transistor including an oxide semiconductor layer, the off-state current can be reduced, and it is possible to achieve a reduction in power consumption when the electric bicycle 1010 is not operated. Note that a pedal is illustrated in FIG. 11B; however, the pedal is not necessarily provided.

Figure 11C:
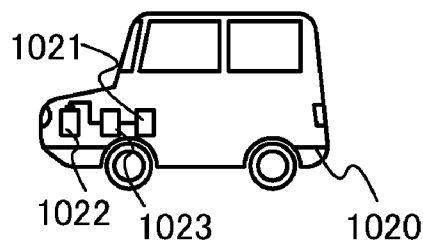
Figure 12:
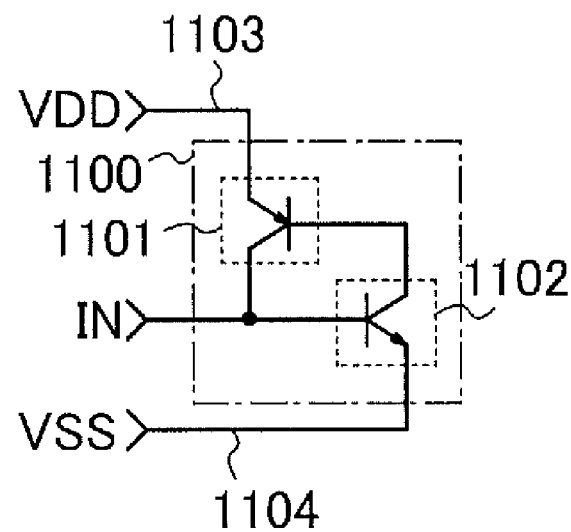
FIG. 12 illustrates a thyristor.

FIG. 11C illustrates an electric car 1020 as an application example of a power conditioner including the semiconductor device. The electric car 1020 obtains power when current flows through a motor unit 1021. Moreover, the electric car 1020 includes a battery 1022 and a power conditioner 1023 for supplying current that is to flow through the motor unit 1021. Note that a means to charge the battery 1022 is not illustrated in FIG. 11C; the battery 1022 may be charged by an electric generator or the like that is additionally provided. Since the power conditioner 1023 including the semiconductor device functioning as a thyristor includes an insulated gate transistor including an oxide semiconductor layer, the off-state current can be reduced, and it is possible to achieve a reduction in power consumption when the electric car 1020 is not operated.

Note that what is described in this embodiment with reference to each drawing can be freely combined or replaced with what is described in other embodiments as appropriate.

This application is based on Japanese Patent Application serial no. 2009-259900 filed with Japan Patent Office on Nov. 13, 2009, the entire contents of which are hereby incorporated by reference.

The invention claimed is:

1. A semiconductor device comprising:
    first to ninth insulated gate transistors;
    a capacitor;
    a buffer circuit;
    a first wiring to which a first high power supply potential is supplied;
    a second wiring to which a second high power supply potential is supplied;
    a third wiring to which a first low power supply potential is supplied; and
    a fourth wiring to which a second low power supply potential is supplied,
    wherein a gate of the first insulated gate transistor is electrically connected to an input terminal, a first terminal of the first insulated gate transistor is electrically connected to the third wiring, and a second terminal of the first insulated gate transistor is electrically connected to a first terminal of the second insulated gate transistor,
    wherein a gate of the second insulated gate transistor is electrically connected to a first terminal of the seventh insulated gate transistor and a first terminal of the eighth insulated gate transistor; and a second terminal of the second insulated gate transistor is electrically connected to a first terminal of the third insulated gate transistor, a first terminal of the fourth insulated gate transistor, and a gate of the sixth insulated gate transistor, wherein a gate of the third insulated gate transistor is electrically connected to the first wiring, and a second terminal of the third insulated gate transistor is electrically connected to the second wiring, wherein a gate of the fourth insulated gate transistor is electrically connected to a first terminal of the fifth insulated gate transistor, a first terminal of the sixth insulated gate transistor, a first electrode of the capacitor, a gate of the eighth insulated gate transistor, and a gate of the ninth insulated gate transistor through the buffer circuit; and a second terminal of the fourth insulated gate transistor is electrically connected to the third wiring, wherein a gate of the fifth insulated gate transistor is electrically connected to the first wiring, and a second terminal of the fifth insulated gate transistor is electrically connected to the second wiring, wherein a second terminal of the sixth insulated gate transistor is electrically connected to the third wiring, wherein a gate of the seventh insulated gate transistor is electrically connected to the first wiring, and a second terminal of the seventh insulated gate transistor is electrically connected to the second wiring, wherein a second terminal of the eighth insulated gate transistor is electrically connected to the third wiring, wherein a first terminal of the ninth insulated gate transistor is electrically connected to an output terminal, and a second terminal of the ninth insulated gate transistor is electrically connected to the fourth wiring, wherein a second electrode of the capacitor is electrically connected to the third wiring, wherein the first to ninth insulated gate transistors each have a semiconductor layer formed using an oxide semiconductor, and wherein a potential of a node at which the gate of the fourth insulated gate transistor, the first terminal of the fifth insulated gate transistor, the first terminal of the sixth insulated gate transistor, the first electrode of the capacitor, and the gate of the eighth insulated gate transistor are electrically connected is supplied to the gate of the ninth insulated gate transistor through the buffer circuit.

2. The semiconductor device according to claim 1, further comprising a resistor,
wherein a first terminal of the resistor is electrically connected to the gate of the first insulated gate transistor, and a second terminal of the resistor is electrically connected to the third wiring.

3. The semiconductor device according to claim 1, wherein a concentration of hydrogen in the oxide semiconductor detected by secondary ion mass spectrometry is $1\times10^{16}/cm^3$ or less.

4. The semiconductor device according to claim 1, wherein a carrier concentration of the oxide semiconductor is less than $1\times10^{14}/cm^3$.

5. The semiconductor device according to claim 1, wherein the first high power supply potential and the second high power supply potential are the same potential.

6. The semiconductor device according to claim 1,
wherein the buffer circuit includes tenth to thirteenth insulated gate transistors,
wherein a gate of the tenth insulated gate transistor is electrically connected to the gate of the second insulated gate transistor, the first terminal of the seventh insulated gate transistor, and the first terminal of the eighth insulated gate transistor; a first terminal of the tenth insulated gate transistor is electrically connected to the second wiring; and a second terminal of the tenth insulated gate transistor is electrically connected to a first terminal of the eleventh insulated gate transistor and a gate of the thirteenth insulated gate transistor,
wherein a gate of the eleventh insulated gate transistor is electrically connected to the gate of the fourth insulated gate transistor, the first terminal of the fifth insulated gate transistor, the first terminal of the sixth insulated gate transistor, the first electrode of the capacitor, the gate of the eighth insulated gate transistor, and a gate of the twelfth insulated gate transistor; and a second terminal of the eleventh insulated gate transistor is electrically connected to the third wiring,
wherein a first terminal of the twelfth insulated gate transistor is electrically connected to the second wiring, and a second terminal of the twelfth insulated gate transistor is electrically connected to a first terminal of the thirteenth insulated gate transistor and the gate of the ninth insulated gate transistor, and
wherein a second terminal of the thirteenth insulated gate transistor is electrically connected to the third wiring.

* * * * *